United States Patent
Wang et al.

(10) Patent No.: US 12,295,185 B2
(45) Date of Patent: May 6, 2025

(54) EPITAXIAL SUBSTRATE HAVING A 2D MATERIAL INTERPOSER, METHOD FOR MANUFACTURING THE EPITAXIAL SUBSTRATE, AND DEVICE PREPARED FROM THE EPITAXIAL SUBSTRATE

(71) Applicant: Hsiao-Lei Wang, Taoyuan (TW)

(72) Inventors: Hsiao-Lei Wang, Taoyuan (TW); Neng-Tai Shih, New Taipei (TW); Kao-Mei Sung, Taoyuan (TW)

(73) Assignee: Hsiao-Lei Wang, Taoyuan (TW)

( * ) Notice: Subject to any disclaimer, the term of this patent is extended or adjusted under 35 U.S.C. 154(b) by 513 days.

(21) Appl. No.: 17/874,063

(22) Filed: Jul. 26, 2022

(65) Prior Publication Data

US 2024/0038931 A1     Feb. 1, 2024

Related U.S. Application Data

(63) Continuation-in-part of application No. 17/790,850, filed on Jul. 5, 2022.

(51) Int. Cl.
| | |
|---|---|
| *H10H 20/825* | (2025.01) |
| *H01S 5/30* | (2006.01) |
| *H01S 5/32* | (2006.01) |
| *H10H 20/01* | (2025.01) |
| *H10H 20/817* | (2025.01) |

(52) U.S. Cl.
CPC ......... *H10H 20/825* (2025.01); *H01S 5/3013* (2013.01); *H01S 5/3203* (2013.01); *H10H 20/01335* (2025.01); *H10H 20/817* (2025.01)

(58) Field of Classification Search
CPC ...................... H10H 20/825; H10H 20/01335
See application file for complete search history.

(56) References Cited

U.S. PATENT DOCUMENTS

| | | | |
|---|---|---|---|
| 2017/0047223 A1* | 2/2017 | Wang | ...................... H10D 62/85 |
| 2022/0384677 A1* | 12/2022 | Chen | ...................... H01L 22/00 |

* cited by examiner

*Primary Examiner* — Douglas M Menz
(74) *Attorney, Agent, or Firm* — Ying-Ting Chen; Law Office of Michael Chen

(57) ABSTRACT

An epitaxial substrate having a 2D material interposer, the epitaxial substrate extending along an epitaxial interface direction, wherein the epitaxial substrate includes: a polycrystalline base substrate having a superficial layer, a wafer bevel, and a back surface, wherein a difference in coefficient of thermal expansion between the polycrystalline base substrate and MN or GaN is not greater than $1.5 \times 10^{-6 \circ}$ $C.^{-1}$ in a direction parallel to the epitaxial interface; a multi-orientation 2D ultra-thin material interposer arranged on the superficial layer of the polycrystalline base substrate, wherein the multi-orientation 2D ultra-thin material interposer has a top layer, a lattice constant of the top layer being highly matched with that of AlN, AlGaN, or GaN; and an AlN, AlGaN, or GaN-based epitaxial layer, which is epitaxially grown on a portion of the multi-orientation 2D ultra-thin material interposer distant from the polycrystalline base substrate.

10 Claims, 8 Drawing Sheets

Prior Art

Prior Art

Prior Art

Prior Art

EPITAXIAL SUBSTRATE HAVING A 2D MATERIAL INTERPOSER, METHOD FOR MANUFACTURING THE EPITAXIAL SUBSTRATE, AND DEVICE PREPARED FROM THE EPITAXIAL SUBSTRATE

FIELD

The present disclosure relates to an epitaxial substrate having a 2D material interposer, a method for manufacturing the epitaxial substrate, and a device, particularly art AlGaN WBG (Wind Bandgap) device and a GaN-based laser diode, prepared from the epitaxial substrate.

BACKGROUND

Epitaxy has an important impact on product quality in the manufacturing process of a light-emitting diode (LED) or a laser diode (LD), and such impacts even include luminous efficiency and durability. This is because, to generate photons smoothly, the LED particularly requires mutual cooperation between electrons and holes upon formation of crystal excitation. On the contrary, if a defect occurs to material form or structure, the mutual combination process between the electrons and holes is more likely hindered by the defect, degrading the luminous effect. The main light-emitting material of the LED selects gallium nitride (GaN), which is generally epitaxially grown on a substrate, while the resulting GaN crystalline form or structure is largely influenced by the substrate adopted. To enhance luminous efficiency and durability of the LED as well as other attributes associated with LED quality, several criteria are usually considered in the art for selecting an appropriate substrate material. Generally, the substrate material is desired to be a single-crystal material that can reduce defect density as much as possible; to minimize the impact on LED crystal quality during the epitaxial process, the substrate material needs to be matched with the epitaxial material in aspects of crystal structure, lattice constant, and CTE (coefficient of thermal expansion).

Currently, the most common substrate material is single-crystal sapphire, mainly due to its good chemical stability and mature manufacturing technology; besides, with increase of production capacity in recent years, substrates made of sapphire are more economical than other alternatives like those made of aluminum nitride (AlN) or even gallium nitride (GaN). However, since sapphire is not well matched with a desired epitaxial material in aspects of crystal structure, lattice constant, and CTE, the GaN or AlGaN epitaxial layer has a relatively high defect density, which affects its application to LDs as well as improvement of UV LED performance. UVC LEDs, whose deep-UV light-emitting wavelength is very effective in disinfection and sterilization, are effective alternatives to replace conventional mercury lamps that are inefficient, energy-consumptive, and environmentally detrimental. The UVC LEDs have huge application potentials in fields of livelihood and routine disinfections. However, the AlN substrates, which are currently most suitable for UV LEDs, encounter bottlenecks in mass production technologies; therefore, current UVC LED development still focuses on sapphire substrate despite its undesirable match degree, resulting in a great hinderance to performance enhancement.

AlN and GaN, the melting points of which are both above 2,500° C., have a high vapor pressure. In other words, the direct melt growth process of manufacturing the single-crystal substrate formed of the above-mentioned two materials not only incurs a higher manufacture cost, but also produces more waste heat that inevitably pollutes the environment. As to the vapor phase crystal growth portion, hydride vapor phase epitaxy (HVPE) currently adopted for GaN crystal growth is used for producing single-crystal GaN substrates; however, limited by manufacture cost and productivity criteria, the cost of HVPE is very high when the mass production technology reaches production of 4-inch substrates. In fact, the vapor phase process still has a defect density higher than other liquid phase crystal growth procedures. However, limited by the overly slow crystal growth rate of the remaining steps, the vapor phase process not only incurs a higher cost, but also makes mass production barely impossible; therefore, the HVPE process is still the mainstream commercial operation when comprehensively considering market demands, device performance, and trade-off between substrate cost and supply capacity. A literature reports that the vapor phase process still has a potential of improving the GaN crystal growth rate to multiple times while maintaining a good crystallinity; however, limited by defect density degradation, the vapor phase process is not adopted as an option to lower the cost of GaN substrate. As to the AlN crystal growth technology, the single-crystal AlN substrate is manufactured using the physical vapor transport (PVT) method, which is a kind of phase vapor process; however, limited by manufacturing technique and yield, only two manufacturers have the capacity of mass production across the world, and the current mass production technology can only achieve manufacturing of 2-inch substrates with a very high cost; furthermore, because the production capacity is only held by the few manufacturers, it does not suffice for extensive supply to the market. Limited by chemical attributes of the AlN and PVT hardware components, some level of carbon (C) and oxygen (O) impurities are inevitably existent in single-crystal products, which also affects device properties to a certain extent.

TABLE 1

| Material | Crystal structure | Lattice constant a | Lattice constant c | CTE $\times 10^{-6} \times K^{-1}$ |
|---|---|---|---|---|
| GaN | Wurtzite | 0.31885 | 0.5185 | $\alpha_a$ 5.59 $\alpha_c$ 3.17 |
| AlN | Wurtzite | 0.31106 | 0.49795 | $\alpha_a$ 4.15 $\alpha_c$ 5.27 |
| ZnO | Wurtzite | 0.32496 | 0.52065 | $\alpha_a$ 4.31 $\alpha_c$ 2.49 |
| SiC 6H | Wurtzite | 0.30806 | 1.51173 | $\alpha_a$ 4.3 $\alpha_c$ 4.7 |
| Sapphire | Rhombohedral | 0.4765 | 1.2982 | $\alpha_a$ 6.66 $\alpha_c$ 5 |
| Si | Diamond | 0.5431 | | 2.6 |

Among the materials listed above, the zinc oxide (ZnO) single-crystal material is a more suitable choice for substrate material in terms of crystal structure, thermal property, and lattice constant, which thus attracts the interest of technical developers to research. However, ZnC has not been extensively applied in the art, the main reason of which is that ZnC has a high chemical activity and is easily corroded by hydrogen-contained substances in the subsequent epitaxial growth step, resulting in an inferior epitaxial layer. As illustrated in FIG. 1, etching of hydrogen 92 to the ZnC substrate 91 likely occurs in the epitaxial growth step; meanwhile, Zinc 93 rapidly diffuses into the epitaxial layer above, degrading the epitaxial quality; even the process is adjusted to improve the epitaxial quality, the zinc and oxygen still diffuse and are doped into LED crystal grains, causing unsatisfactory luminous attributes; therefore, ZnO substrates do not meet practical market requirements.

The same circumstance likely occurs to the substrate-epitaxy combination of other types of optoelectronic devices currently in use, e.g., silicon carbide (SiC) or gallium arsenide (GaAS), etc., wherein single-crystal SiC is currently a substrate material for high-performance power semiconductors and high-end LEDs, the single-crystal growth step of which adopts physical vapor transport (PVT) in the vapor phase method. However, high-quality large-size SiC single-crystal growth technology is highly complex, and high-end mass production know-how is in the hand of only a few manufacturers; therefore, the cost of the SiC applications still have a large room for improvement.

Emerging 2D (two-dimensional) materials are now gaining rapid momentum. Among the members of 2D material family, graphene is the earliest member that has attracted heavy research inputs and also the most well-known 2D material, the 2D laminated structure of which has a special or excellent physical/chemical/mechanical/optoelectronic properties; however, there is no strong bonding between layers, and the layers are only bonded by Van der Waals force, which means no dangling bonds exist on the surface of the laminated structure. Currently, graphene has been verified to have extensive and superb application potentials. Researches on graphene are going on across the world, which also drives research and development on more 2D materials, including TMDs (transition metal dichalcogenides) such as $WS_2$ illustrated in the top view of FIG. 2, hBN (hexagonal boron nitride) illustrated in the top view of FIG. 3, and black phosphorus, which are also members of the 2D material family that have achieved fruitful outcomes. The above materials all have their unique attributes and application potentials, and their manufacturing technologies are also being developed proactively. Besides superb optoelectronic properties, graphene, hBN, and $MoS_2$ as members of TMDs, are all deemed to have an excellent diffusion barrier attribute and different levels of high-temperature stability; the hBN particularly has a superb chemical inertness and high-temperature oxidative resistance.

Thanks to the homogeneity of the above laminated structure and the inter-layer Van der Waals force bonding attribute, it becomes technically feasible to manufacture a layered stacked hetero-structure with two or more members of the 2D material family. Besides combination of different attributes, the heterostructure further makes it possible to create new applied attributes or manufacture new devices, the research on which is currently very active in the optoelectronic and semiconductor fields. FIGS. 4a and 4b illustrate a schematic diagram of a mechanically formed lamination, and FIG. 5 illustrates a schematic diagram of physical or chemical vapor phase deposition.

The Van der Waals force bonding attribute of 2D materials also arouses the interest in uses of epitaxial substrates applied to conventional 3D materials. It is key that in the epitaxial technology, the epitaxial material must be well matched with the substrate material in aspects of crystal structure, lattice constant, and CTE; however, in reality, an appropriate material is always unavailable, or an ideal substrate material has a relatively high cost or is hardly accessible, which are also technical problems encountered by the subject matter of the disclosure; in this case, 2D materials provide another solution to heteroepitaxial substrates, i.e., Van der Waals epitaxy. The mechanism for the Van der Waals epitaxy to be beneficial to the heteroepitaxy comes from replacement of the direct chemical bond of a conventional epitaxial interface with the Van der Waals force bonding, such that the stress or strain which does not match the lattice constant and thermal expansion coefficient in the epitaxial step can be relieved to a certain extent, thereby improving the quality of the epitaxial layer; or, through introduction of the 2D material and the Van der Waals epitaxy, some previously impractical heteroepitaxial technologies become possible. Relevant researches also indicate that when the 2D materials are laminated relative to each other into a heterostructure, the action force therebetween is mainly the Van der Waals force; while when epitaxially growing a 3D material on a 2D material, the dangling bonds existent in the 3D material on the interface contribute simultaneously to the bonding force of the interface; in this case, the epitaxy is substantively not a pure Van der Waals epitaxy, but actually a quasi Van der Waals epitaxy. Irrespective of which circumstances, the match degree in aspects of lattice and thermal expansion still contributes somewhat to the resulting epitaxial quality. The 2D material interposer and the substrate material both contribute to the overall match degree. The 2D laminated material has a hexagon or honeycomb structure, which is regarded as structurally compatible with the wurtzite and Zinc-blende structural material during the epitaxial growth step. The main epitaxial materials in the art of the disclosure belong to this type of structure.

Based on uses of the epitaxial substrate, single crystal is one of the requirements to ensure epitaxial quality. FIG. 7 shows a conventional technology of forming a homogeneous or heterogenous epitaxial layer 8 by homogenized or heterogeneous epitaxial growth on the surface of the high-quality single-crystal substrate 7. Conventionally, the AlGaN WBG device is epitaxially grown on the sapphire or AlN, and the GaN-based LD is epitaxially grown on the high-quality single-crystal GaN. In the case of epitaxially growing the AlGaN WBG device on the sapphire, the bad match degree causes a relatively high defect density (the epitaxial layer detect density>$10^8$/cm$^2$), seriously affecting device efficiency; the UVC LED device's overall luminous efficiency is degraded due to internal reflection induced by the large difference in the refraction index between AlGaN and sapphire; therefore, the external quantum efficiency EQE of current devices available in the market is far lower than 10%. A high-quality AlN single-crystal substrate is ideal for AlGaN epitaxy. Since its lattice constant and CTE are highly matched with those of the epitaxial layer, the resulting epitaxial layer defect density is lower than $10^5$/cm$^2$. Currently, limited by the PVT manufacturing technology, the UVC band spectrum is absorbed by specific impurities contained therein, causing the EQE of the devices on the current market lower than 10%. The PVT AlN manufacturing technology can only manufacture 2-inch wafers with a low yield at a high cost. The only two PVT AlN suppliers in the world have their production capacity controlled by specific corporations, such that their production capacity can hardly satisfy market demands. The high-quality single-crystal GaN used for GaN-based LD epitaxy has a relatively high manufacture cost; however, limited by the manufacturing technology, the HVPE GaN crystalline detect density is 100 to 1.000 times the defect density of the sapphire substrate, with the defect density level reaching $10^5$/cm$^2$ and only 4-inch wafers can be mass produced; since the LD efficiency is highly sensitive to the epitaxial layer defect density, existing GaN single crystal substrates are not an ideal option, but the market still lacks a better solution.

In recent years, researches have revealed that the members in the 2D material family are generally ideal substrate materials for each other for heterogeneous epitaxy, e.g., hBN is regarded as an optimal epitaxial substrate for a TMD (transition metal dichalcogenides) material; the researches reveal that the single-crystal hBN surface enables epitaxial growth of TMD materials such as $MoS_2$, $WS_2$, $MoSe_2$, and $WSe_2$ while maintaining the surface area of as high as 95% to be a single-crystal continuous film.

Generally, growth of a 2D material in the nucleation step would exhibit a relevance with the crystal orientation of the crystalline substrate. In a case where the substrate adopts a typical metal foil which is of a polycrystalline structure, non-uniform orientations are already formed during the nucleation step of the 2D material, and after the growing crystal nucleus is polymerized into a continuous thin film, the 2D material still has domains of different orientations, rather than being a single crystal; in a case where the substrate adopts a single crystal material such as sapphire, since the structure of the 2D material and the structure of the sapphire substrate are symmetrical and relevant, it is likely that the resulting particular nucleation orientation is not unique, and a single-crystal continuous film cannot be formed. Therefore, the process for fabricating a hBN single-crystal continuous film suitable for the advanced electronic device wafer grade still faces a great challenge.

In recent years, researches reveal that a TMD material such as laminated $MoS_2$, $WS_2$, $MoSe_2$, or $WSe_2$ with good crystallinity may be grown on a single-crystal c-plane sapphire surface by CVD; however, the grown TMD material does not have a single crystal structure, but follows two crystal orientations (0° C. and 60° C.), which is still considered as a to-be-overcome challenge (see Nature 2019, v. 567, 169-179). As illustrated in FIG. 6, for the AlGaN and GaN materials which are the interests of the disclosure, since their crystal structure has a hexagonal symmetricity on the epitaxial interface, when the TMD layer serves as the epitaxial substrate, it theoretically does not hinder the AlGaN/GaN epitaxial layer from forming a single crystal despite the fact that the TMD layer is not a single crystal layer. Currently, the technology of peeling off the TMD layer from the sapphire and transferring the TMD layer to another substrate surface already becomes practically implementable and mass applicable; in addition, the sapphire substrate is recyclable, the fabrication process of which has become commercially feasible for mass production (see ACS Nano 2015, 9, 6, 6178-6187). Therefore, the disclosure utilizes the drawbacks brought by different crystal orientations in the above-mentioned researches and attempts to further research on the process in order to manufacture a TMD single crystal continuous film using the above-mentioned method and further create a feasible solution suitable for mass production by arranging the polycrystalline TMD layer on the sapphire surface to a substrate whose CTE is highly matched with that of AlGaN and GaN, whereby to epitaxially grow a single-crystal AlGaN/GaN-based epitaxial layer.

SUMMARY

In an aspect, an epitaxial substrate having a 2D material interposer is provided for an electronic device that needs a single-crystal epitaxial substrate, thereby solving problems existent in conventional UVC, LED and GaN-based LD epitaxial substrates.

In another aspect, a method for manufacturing the epitaxial substrate is provided, whereby to epitaxially grow a single-crystal AlN, AlGaN, or GaN-based epitaxial layer on a polycrystalline base substrate.

In a further aspect, a device prepared from the epitaxial substrate is provided, such as an AlGaN WBG device and a GaN-based laser diode.

In some embodiments, an AlN, AlGaN, or GaN-based wide bandgap optoelectronic device is provided, comprising: an epitaxial substrate having a 2D material interposer, extending along an epitaxial interface direction, the epitaxial substrate comprising: a polycrystalline base substrate having a superficial layer, a wafer bevel, and a back surface, a difference in coefficient of thermal expansion between the polycrystalline base plate and AlN or GaN in the direction parallel to the epitaxial interface is not greater than $1.5 \times 10^{-6\circ}$ $C.^{-1}$; a multi-orientation 2D ultra-thin material interposer arranged on the superficial layer of the polycrystalline base substrate, the multi-orientation 2D ultra-thin material interposer having a top layer, a lattice constant of the top layer being highly matched with that of AlN, AlGaN, or GaN; and an AlN, AlGaN, or GaN-based epitaxial layer, which is epitaxially grown on a portion of the multi-orientation 2D ultra-thin material interposer distant from the polycrystalline base substrate, serving as an active layer. The AlN, AlGaN, or GaN-based wide bandgap optoelectronic device further comprises a pair of actuating electrodes actuating the epitaxial substrate; and an encapsulation layer encapsulating the epitaxial substrate.

In some embodiments, an epitaxial substrate having a 2D material interposer is further provided, the epitaxial substrate extending along an epitaxial interface direction, the epitaxial substrate comprising: a polycrystalline base substrate having a superficial layer, a wafer bevel, and a back surface, a difference in coefficient of thermal expansion between the polycrystalline base substrate and AlN or GaN in the direction parallel to the epitaxial interface is not greater than $1.5 \times 10^{-6\circ}$ $C.^{-1}$; a multi-orientation 2D ultra-thin material interposer arranged on the superficial layer of the polycrystalline base substrate, the multi-orientation 2D ultra-thin material interposer having a top layer, a lattice constant of the top layer being highly matched with that of AlN, AlGaN, or GaN; and an AlN, AlGaN or GaN-based epitaxial layer, which is epitaxially grown on a portion of the multi-orientation 2D ultra-thin material interposer distant from the polycrystalline base substrate.

In some embodiments of the epitaxial substrate having a 2D material interposer, the multi-orientation 2D ultra-thin material interposer is a composite laminated structure comprising a top layer and an underlayer being heterogeneously bonded, a lattice constant misfit between the top layer and AlN or GaN being not greater than 20% and suitable for AlN, AlGaN or GaN epitaxy.

In some embodiments, a method for manufacturing an epitaxy substrate having a 2D material interposer is provided, comprising: Step 1: forming a continuous thin film composed of two crystalline domains matched in a 60° angle relative to each other by growing the multi-orientation 2D ultra-thin material interposer on the surface of a hexagonal symmetrically structured single-crystal substrate, wherein a lattice constant of a superficial layer of the continuous thin layer is highly matched with AlGaN/GaN;

Step 2: transferring the multi-orientation 2D ultra-thin material interposer from the hexagonal symmetrically structured single-crystal substrate onto a superficial layer of a polycrystalline base substrate material;

Step 3: epitaxially growing an AlN, AlGaN or GaN-based epitaxial layer on the multi-orientation 2D ultra-thin material interposer to obtain an epitaxial substrate having a 2D material interposer.

The substrate of the disclosure satisfies epitaxially growing of a single-crystal layer on the polycrystalline, base substrate with a feasible technology, wherein the lattice constant of the 2D materials ($WS_2$ and $MoS_2$, etc.) is highly matched with that of the c-plane AlGaN and GaN, and the CTE of the polycrystalline base substrate (e.g., sintered AlN) is highly matched with that of AlGaN and GaN. In addition, since the sintered AlN technology enables manufacturing of a large-size (6 inches and above) base and its manufacture cost is far lower than a relevant single-crystal wafer (GaN, AlN, and sapphire), the disclosure solves the problems existing in the epitaxy substrate of conventional UVC LEDs and GaN-based Lis with significant reduction of process costs, and may effectively enhance the efficiency of the AlGaN WBG optoelectrical devices and GaN-based LD devices with reduced manufacture costs.

DETAILED DESCRIPTION

Figure 1:
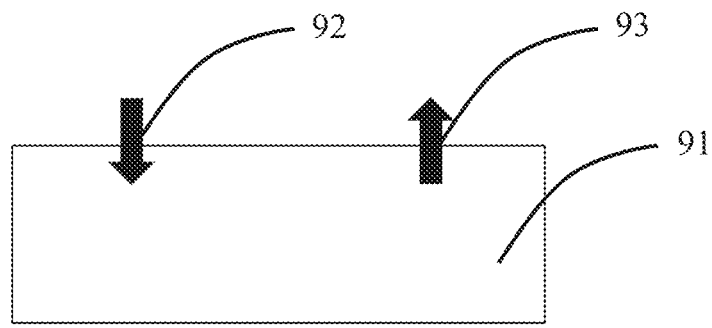
FIG. 1 is a schematic diagram of a ZnO substrate corroded during an epitaxial process.
Figure 2:
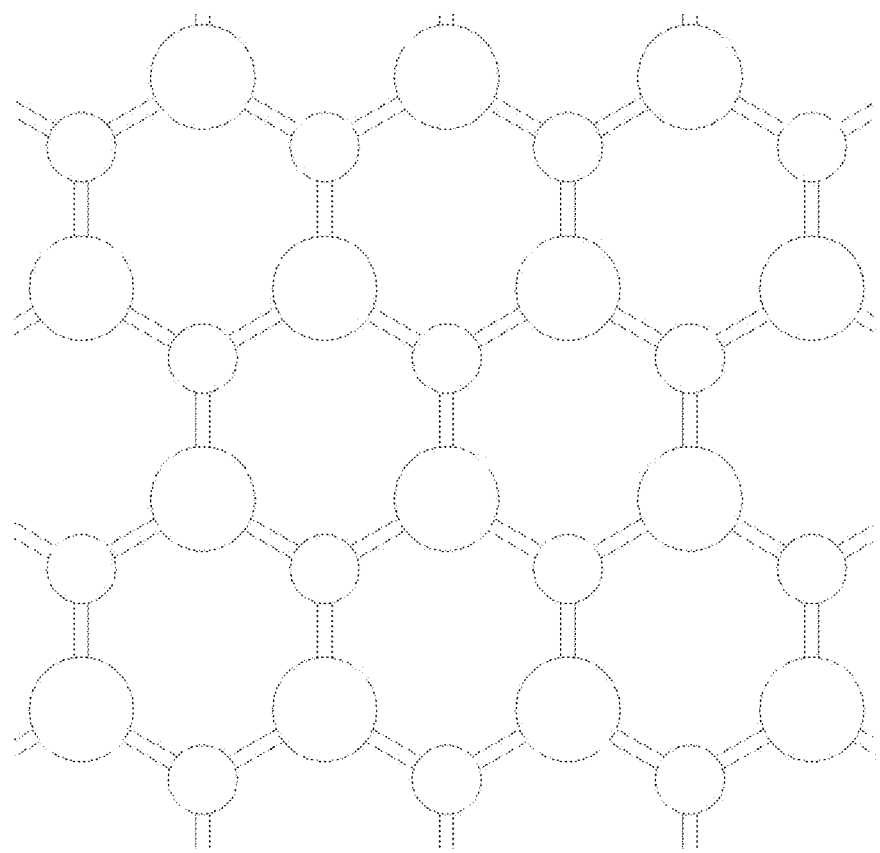
FIG. 2 is a structural schematic diagram of a 2D material transition metal dichalcogenide (TMD)
Figure 3:
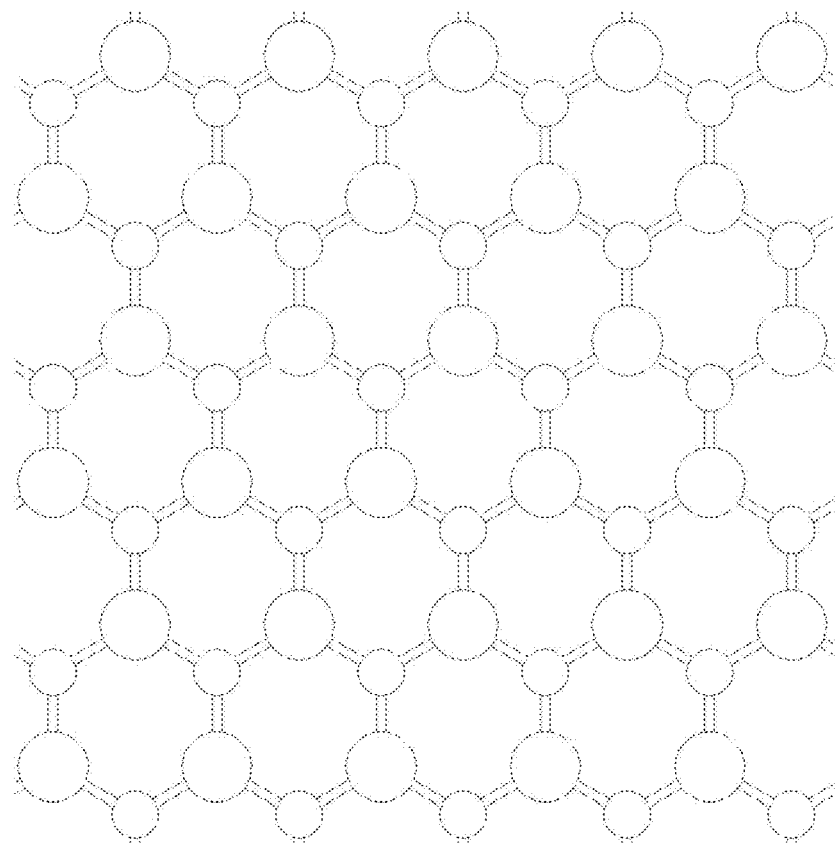
FIG. 3 is a structural schematic diagram of a 2D material hexagonal boron nitride (hBN)
Figure 4A:
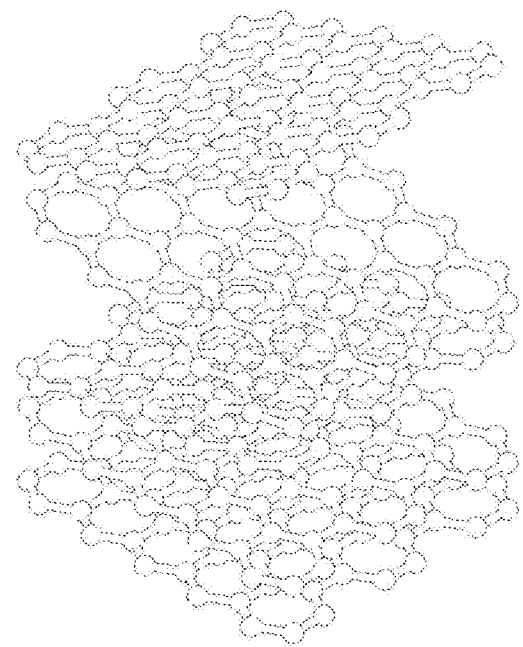
FIG. 4a and FIG. 4b are schematic diagrams of mechanically formed laminations.
Figure 4B:
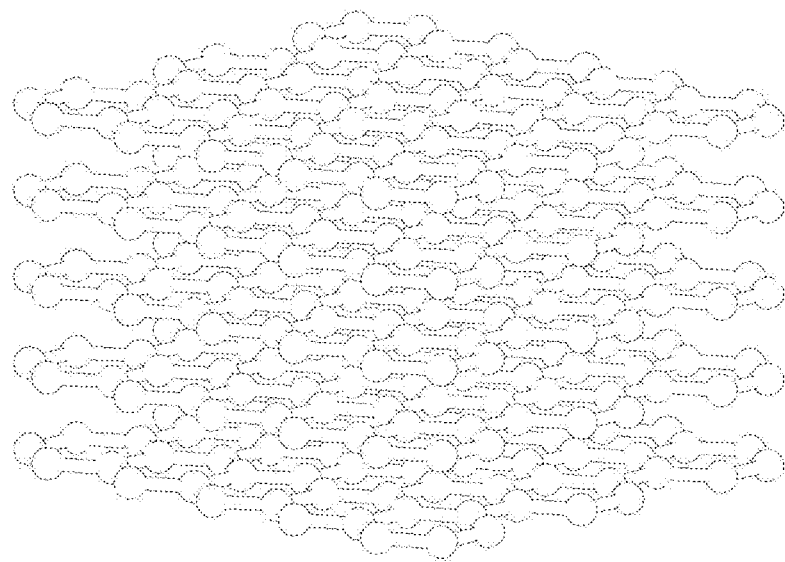
Figure 5:
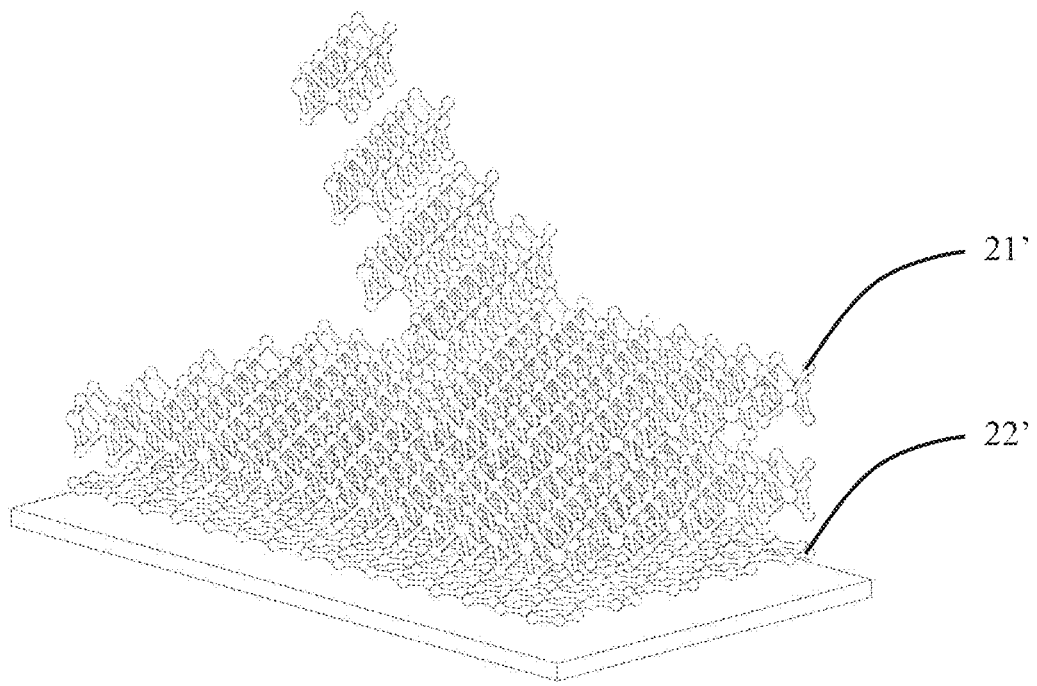
FIG. 5 is a schematic diagram of physical and chemical vapor depositions.
Figure 6:
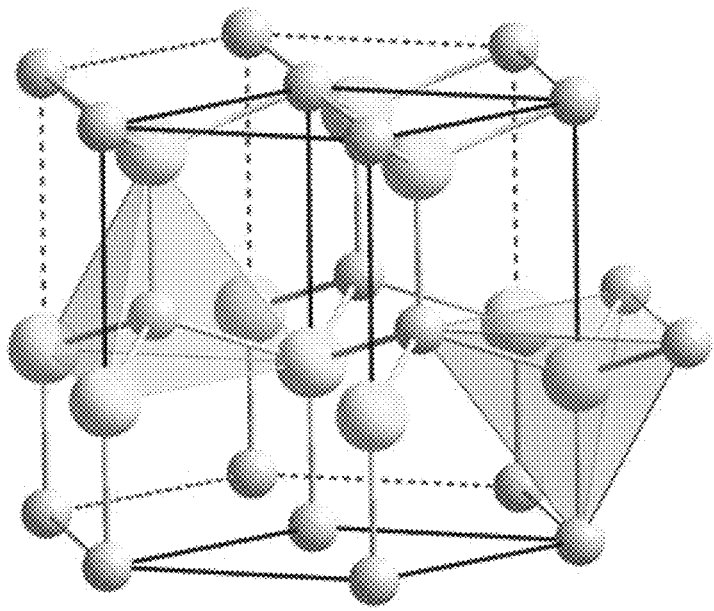
FIG. 6 is a hexagonal symmetrical structural diagram of a crystal structure on an epitaxial interface.
Figure 7:
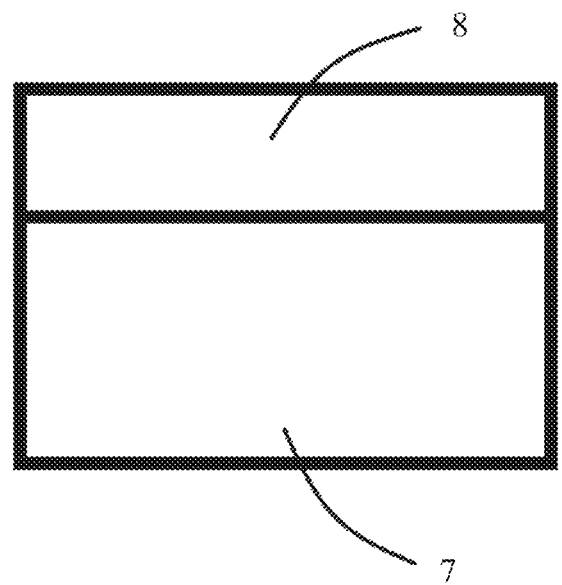
FIG. 7 is a schematic diagram of homogeneous or heterogeneous epitaxial growth on a high-quality single-crystal substrate in a conventional technology.

The above and other technical contents, features and effects of the disclosure will become more apparent in the detailed description below through preferred embodiments with reference to the drawings; in addition, like reference numerals represent identical elements throughout the examples.

Figure 8:
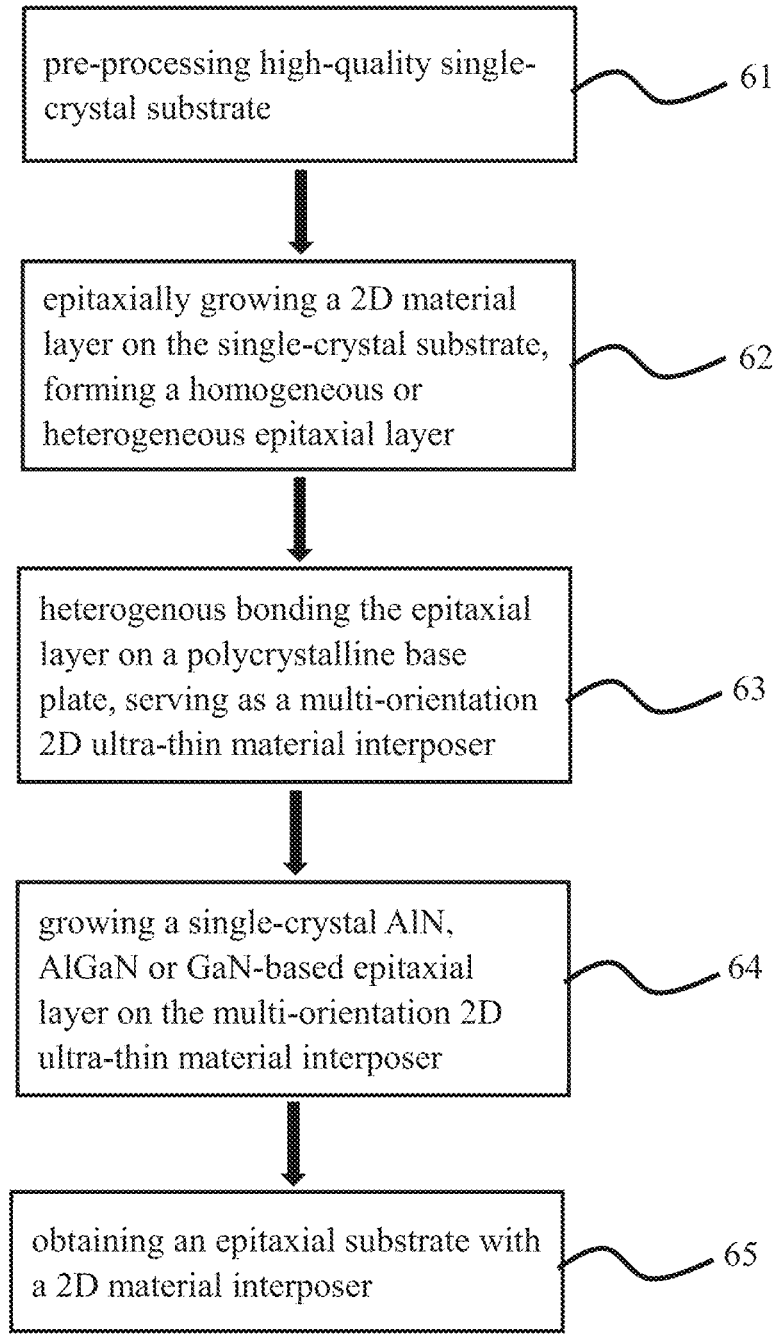
FIG. 8 is a flow chart diagram of a method for manufacturing an epitaxial substrate having a 2D material interposer according to the disclosure.
Figure 9:
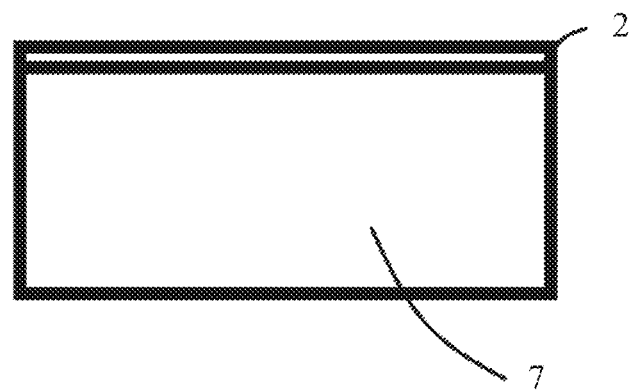
FIG. 9 is a schematic diagram of step 1 of the method for manufacturing an epitaxial substrate having a 2D material interposer according to the disclosure.

Referring to FIG. 8 in conjunction with FIGS. 9, 10, 11, and 12, a method for manufacturing an epitaxial substrate having a 2D material interposer, comprising: step 61: first preparing a high-quality single-crystal substrate 7 satisfying an epitaxial growth grade. In this example, the starting material adopts a polished single-crystal sapphire substrate (wafer). After appropriate pre-processing (including wafer cleaning), a multi-orientation 2D ultra-thin material interposer 2 formed of two crystalline domains matched with each other at an angle of 60° is hetero-epitaxially grown on the single-crystal substrate 7 in step 62; in this example, the multi-orientation 2D ultra-thin material interposer 2 is a polycrystalline $WS_2$ layer. The 2D material is grown on the surface of the single-crystal substrate 7. In this example, the polycrystalline $WS_2$ is grown on a high-quality single-crystal sapphire substrate by a growth process, wherein the polycrystalline $WS_2$ serves as the to-be-transferred multi-orientation 2D ultra-thin material interposer 2. It is noted that in addition to the growth process, those skilled in the art may also adopt processes such as deposition or coating as required to manufacture the multi-orientation 2D ultra-thin material interposer 2.

Figure 10:
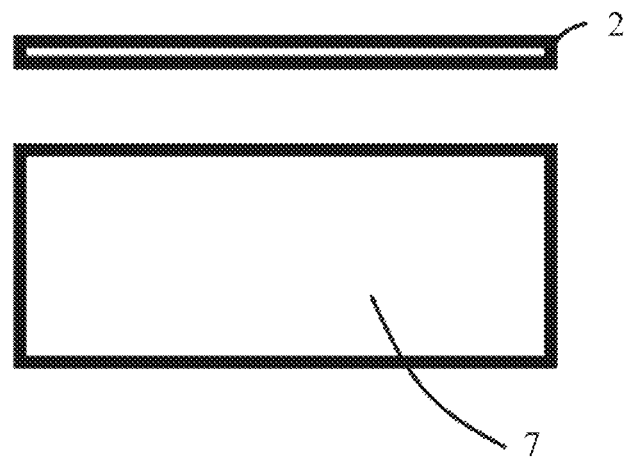
FIG. 10 is a schematic diagram of removing the to-be-transferred multi-orientation 2D ultra-thin material from the single-crystal substrate in step 2 of the method for manufacturing an epitaxial substrate having a 2D material interposer according to the disclosure.
Figure 11:
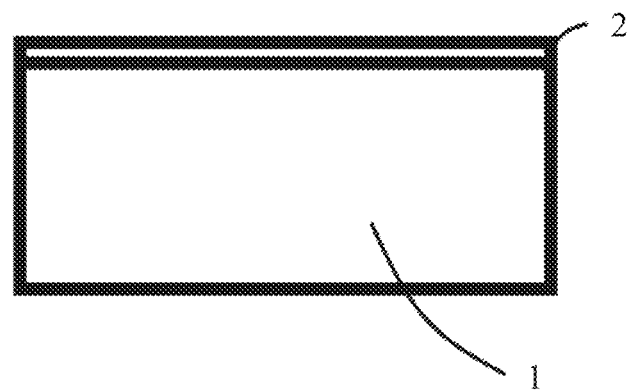
FIG. 11 is a schematic diagram of step 2 of the method for manufacturing an epitaxial substrate having a 2D material interposer according to the disclosure.

FIGS. 10 and 11 illustrate step 63 in which the multi-orientation 2D ultra-thin material interposer 2 which was previously arranged on the single-crystal substrate 7 is heterogeneously transferred to the surface of a polycrystalline base substrate 1 using the Van der Waals bond attribute, the total thickness being above 0.5 nm. In this example, the polycrystalline $WS_2$ layer suitable for AlN, AlGaN or GaN epitaxy is peeled off from the sapphire surface and transferred to the surface of the polycrystalline base substrate 1, forming a multi-orientation 2D ultra-thin material interposer 2, wherein the lattice constant misfit of the superficial layer of the multi-orientation 2D ultra-thin material interposer 2 with respect to AlN, AlGaN, or GaN is not greater than 5%.

In this example, the multi-orientation 2D ultra-thin material interposer 2 with a thickness of about 3 to 5 nm is transferred to the surface of the polycrystalline base substrate 1, while the polycrystalline base substrate 1 in this example is sintered AlN. The multi-orientation 2D ultra-thin material interposer 2 is prone to generate two types of crystalline domains mutually matched with each other at an angle of 60°, such that the formed multi-layered $WS_2$ can hardly satisfy the requirement of single crystal orientation; moreover, the top layer at the upper surface of the $WS_2$ layer has a lattice constant which is required to match with that of AlN, AlGaN or GaN till the misfit being lower than 5%. In this example, since the misfit is not greater than 5%, the multi-orientation 2D ultra-thin material interposer layer is suitable for AlN, AlGaN, or GaN epitaxial growth.

Figure 12:
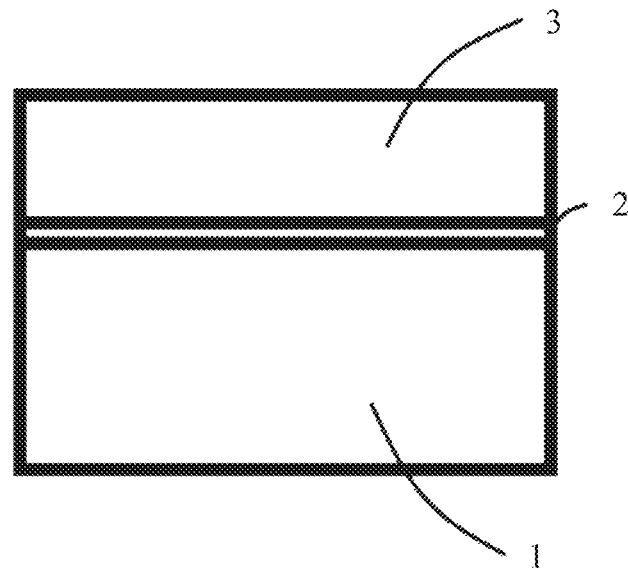
FIG. 12 is a structural schematic diagram of a first example of the disclosure.

In step 64, a single-crystal AlN, AlGaN or GaN-based epitaxial layer 3 is grown on the multi-orientation 2D ultra-thin material interposer 2 by Van der Waals epitaxy, and through processing in step 65, an epitaxial substrate having a 2D material interposer is finally obtained, i.e., the structure of the first example, as illustrated in FIG. 12. The range of criteria for the polycrystalline base substrate 1 is that the difference in CTE between the polycrystalline base substrate 1 and MN or GaN in the direction parallel to the epitaxial interface is not greater than $1.5 \times 10^{-6}$ $°C.^{-1}$, so as to maintain stable material quality in the AlGaN and GaN epitaxial process without causing damages to reduce yields.

Figure 13:
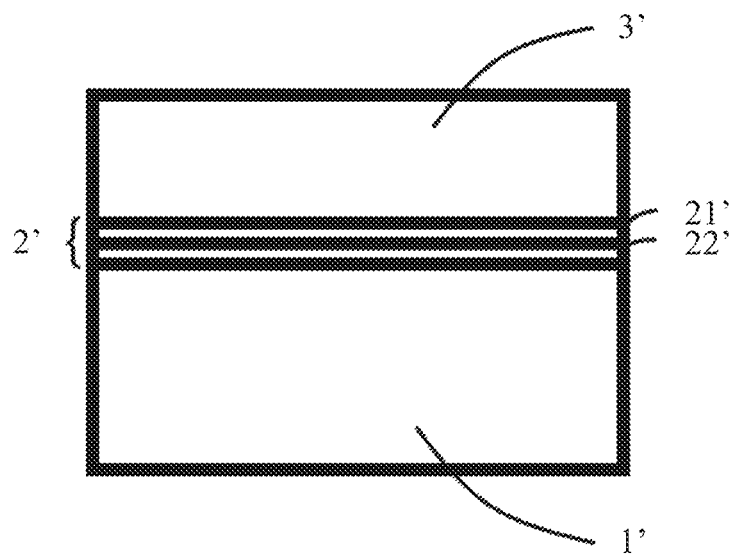
FIG. 13 is a structural schematic diagram of a second example of the disclosure.

Of course, as can be easily understood by those skilled in the art, the multi-orientation 2D ultra-thin material interposer 2' may also be a composite laminated structure, as shown in FIG. 13. In a second example of the disclosure, the polycrystalline base substrate 1' and the AlN, AlGaN, or GaN-based epitaxial layer 3' are identical to those in the first example, which will not be detailed here. In this example, the multi-orientation 2D ultra-thin material interposer 2' is a composite laminated structure comprising a top layer 21' and an underlayer 22', which are bonded by a heterogeneous material, wherein the lattice constant misfit between the top-layer and AlN, AlGaN or GaN is not greater than 20%, thus suitable for AlN, AlGaN GaN or GaN epitaxy, e.g., $MoSe_2$; the underlayer 22' is a 2D continuous ultra-thin material (e.g., hexagonal boron nitride hBN) that is suitable for epitaxially growing a TMD material such as $MoS_2$, $WS_2$, $MoSe_2$, or $WSe_2$ to maintain and extend the underlayer orientation.

TABLE 2

| Material | Lattice Constant a (nm) |
|---|---|
| hBN | 0.25 |
| graphene | 0.246 |
| $WS_2$ | 0.318 |
| $MoS_2$ | 0.3161 |
| $WSe_2$ | 0.3297 |
| $MoSe_2$ | 0.3283 |

In this example, the multi-orientation 2D ultra-thin material interposer 2' is heterogeneously bonded to the underlayer 22' exemplarily illustrated as a multi-orientation hBN underlayer 22', the multi-orientation hBN layer is transferred to the surface of the polycrystalline base substrate 1' and then a 2D material such as the top layer is arranged on the underlayer. Of course, those skilled in the art may easily understand that although the material of the underlayer 22' in this example is illustrated as hNB, it is not limited to hBN.

Figure 14:
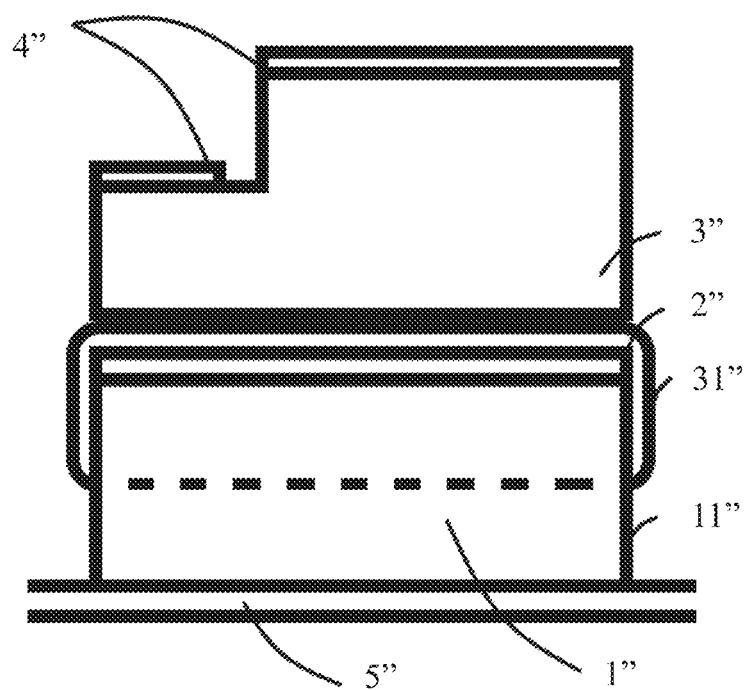
FIG. 14 is a structural schematic diagram of a third example of the disclosure.

FIG. 14 illustrates an AlN, AlGaN or GaN-based WBG optoelectronic device according to a third example of the disclosure, wherein the AlN, AlGaN or GaN-based WBG optoelectronic device is formed by further performing necessary manufacturing steps including subsequent epitaxial growth on the epitaxial substrate having a 2D material interposer. The epitaxial substrate with the 2D material interposer has a polycrystalline base substrate 1", wherein a continuous surface formed of each side sur ace of the polycrystalline base substrate 1" forms a wafer bevel 11" of the polycrystalline base substrate 1". An exemplary single-layered $MoSe_2$ composed of two crystalline domains matched with each other at a 60° angle is transferred onto the surface of the polycrystalline base substrate 1", serving as the multi-orientation 2D ultra-thin material interposer 2" in this example, wherein the multi-orientation 2D ultra-thin material interposer 2" has a top layer, the lattice constant misfit between the top layer and AlN, AlGaN or GaN being not greater than 5%; therefore, the top layer is suitable for AlN, AlGaN or GaN epitaxy.

Different from the previous examples, the single-crystal AlN, AlGaN or GaN-based epitaxial layer 3" in this example further comprises a coating portion 31" which first forms a buffer layer or a nucleation layer at the portion proximal to the multi-orientation 2D ultra-thin material interposer 2", the coating portion at least completely covering the top layer and the edge of the multi-orientation 2D ultra-thin material interposer 2", and further covering the wafer bevel 11' of the polycrystalline base substrate 1" to a predetermined thickness range towards the lower portion of the figure, thereby offering a better nucleation effect and epitaxial quality for the AlN, AlGaN or GaN-based epitaxy and meanwhile structurally providing a protective cover to the edge of the polycrystalline base substrate and the edge of the 2D material interposer. The coating portion 31" of the single-crystal AlN, AlGaN or GaN-based epitaxial layer 3" is exemplarily illustrated as an AlN layer grown by CVD (chemical vapor deposition); to protectively cover the wafer bevel, the coating portion 31" may cover the whole top surface and edge of the multi-orientation 2D ultra-thin material interposer 2", as well as the exemplarily 10-nm portion of the wafer bevel 11' of the polycrystalline base substrate 1".

Furthermore, the coating portion 31" may at most completely cover the wafer bevel 11' and the back surface of the polycrystalline base substrate 1", wherein the wafer bevel 11" is a continuous surface formed of each side surface of the polycrystalline base substrate 1"; the coverage extent is controlled or influenced by different process capacities and parameters; those skilled in the art may form the coating portion 31" using an appropriate material and process such as sputter, CVD (chemical-vapor deposition), and MBE (molecular beam epitaxy) growth or deposition, not limited to the AlN layer grown by CVD Finally, the single-crystal AlN, AlGaN or GaN-based epitaxial layer 3" continues epitaxial growth to manufacture an active layer of the AlN, AlGaN or GaN-based WBG optoelectronic device, wherein AlGaN is used for C-band LED in the UVC LED ultraviolet, while GaN is used for the blue LD (laser diode). A pair of actuating electrodes 4" actuating the epitaxial substrate are arranged on the single-crystal AlN, AlGaN or GaN-based epitaxial layer 3"; an encapsulating layer 5" is configured to encapsulate the epitaxial substrate with the 2D material interposer, thereby forming the AlN, AlGaN or GaN-based WBG optoelectronic device.

The disclosure solves the issues including defect density and misfit of conventional UVC LED and GaN-based WBG epitaxial substrates and can significantly lower manufacture costs, which not only improves product throughput, but also enables large-area fabrication due to significant reduction of defects. The present disclosure further improves device efficiency of AlGaN WBG optoelectronic and electronic devices and GaN-based LDs, significantly improves product yield of mass production, and lowers manufacture cost.

What have been described above are only examples of the disclosure, not intended for limiting the scope of the disclosure. Any simple equivalent variations and modifications based on the scope and specification of the disclosure falls within the scope of the disclosure.

We claim:

1. An aluminum nitride AlN, aluminum gallium nitride AlGaN, or gallium nitride GaN-based wide bandgap optoelectronic device, comprising:
    an epitaxial substrate having a two-dimensional 2D material interposer, the epitaxial substrate extending along an epitaxial interface direction, comprising:
        a polycrystalline base substrate having a superficial layer, a wafer bevel, and a back surface, wherein a difference in coefficient of thermal expansion between the polycrystalline base substrate and AlN or GaN is not greater than $1.5 \times 10^{-6}$ $C.^{-1}$ in a direction parallel to the epitaxial interface;
        a multi-orientation 2D ultra-thin material interposer arranged on the superficial layer of the polycrystalline base substrate, wherein the multi-orientation 2D ultra-thin material interposer has a top layer, a lattice constant of the top layer being highly matched with that of AlN, AlGaN, or GaN; and
        an AlN, AlGaN, or GaN-based epitaxial layer, which is epitaxially grown on a portion of the multi-orientation 2D ultra-thin material interposer distant from the polycrystalline base substrate, to serve as an active layer;

at least a pair of actuating electrodes which actuate the epitaxial substrate; and an encapsulation layer which encapsulates the epitaxial substrate.

2. An epitaxial substrate having a two-dimensional 2D material interposer, the epitaxial substrate extending along art epitaxial interface direction, wherein the epitaxial substrate comprises:

a polycrystalline base substrate having a superficial layer, a wafer bevel, and a back surface, wherein a difference in coefficient of thermal expansion between the polycrystalline base substrate and AlN or GaN is not greater than $1.5 \times 10^{-6}$ °C.$^{-1}$ in a direction parallel to the epitaxial interface;

a multi-orientation 2D ultra-thin material interposer arranged on the superficial layer of the polycrystalline base substrate, wherein the multi-orientation 2D ultra-thin material interposer has a top layer, a lattice constant of the top layer being highly matched with that of AlN, AlGaN, or GaN; and an AlN, AlGaN, or GaN-based epitaxial layer, which is epitaxially grown on a portion of the multi-orientation 2D ultra-thin material interposer distant from the polycrystalline base substrate.

3. The epitaxial substrate having a 2D material interposer according to claim 2, wherein the multi-orientation 2D ultra-thin material interposer is a composite laminated structure comprising a top layer and an underlayer being heterogeneously bonded, wherein a lattice constant misfit between the top layer and AlN, AlGaN, or GaN is not greater than 20%, and thus the top layer is suitable for AlN, AlGaN or GaN epitaxy.

4. The epitaxial substrate having a 2D material interposer according to claim 2, wherein the multi-orientation 2D ultra-thin material interposer has a thickness greater than 0.5 nm.

5. The epitaxial substrate having a 2D material interposer according to claim 2, wherein the multi-orientation 2D ultra-thin material interposer is selected from a group consisting of hBN, $MoS_2$, $WS_2$, $MoSe_2$ or $WSe_2$.

6. The epitaxial substrate having a 2D material interposer according to claim 2, further comprising: a coating portion which covers the multi-orientation 2D ultra-thin material interposer, wherein the coating portion at least completely covers the top layer and edge of the multi-orientation 2D ultra-thin material interposer and at least partially covers the wafer bevel.

7. The epitaxial substrate having a 2D material interposer according to claim 6, wherein the coating portion further completely covers the wafer bevel and the back surface of the polycrystalline base substrate.

8. The epitaxial substrate having a 2D material interposer according to claim 2, wherein at least the top layer of the multi-orientation 2D ultra-thin material interposer is formed of two crystalline domains matched with each other at an angle of 60°.

9. A method for manufacturing an epitaxial substrate having a 2D material interposer, comprising:

forming a continuous thin film comprising two types of crystalline domains matched with each other at an angle of 60° by growing a multi-orientation 2D ultra-thin material interposer on a surface of a hexagonal symmetrically structured single-crystal substrate, wherein a lattice constant of the continuous thin layer is highly matched with that of AlN, AlGaN, or GaN;

transferring the multi-orientation 2D ultra-thin material interposer from the hexagonal symmetrically structured single-crystal substrate onto a superficial layer of the polycrystalline, base substrate; and growing epitaxially an AlN, AlGaN, or GaN-based epitaxial layer on the multi-orientation 2D ultra-thin material interposer to obtain the epitaxial substrate with a 2D material interposer.

10. The manufacturing method of an epitaxial substrate having a 2D material interposer according to claim 9, wherein the multi-orientation 2D ultra-thin material interposer is deposited or coated on the surface of the hexagonal symmetrically structured single-crystal substrate.

* * * * *